United States Patent
Lanois et al.

(10) Patent No.: US 10,177,218 B2
(45) Date of Patent: Jan. 8, 2019

(54) VERTICAL SEMICONDUCTOR STRUCTURE

(71) Applicant: STMicroelectronics (Tours) SAS, Tours (FR)

(72) Inventors: Frédéric Lanois, Tours (FR); Alexei Ankoudinov, Redwood, WA (US); Vladimir Rodov, Seattle, WA (US)

(73) Assignee: STIMICROELECTRONICS (TOURS) SAS, Tours (FR)

( * ) Notice: Subject to any disclaimer, the term of this patent is extended or adjusted under 35 U.S.C. 154(b) by 0 days.

(21) Appl. No.: 15/365,335

(22) Filed: Nov. 30, 2016

(65) Prior Publication Data

US 2017/0301752 A1    Oct. 19, 2017

(30) Foreign Application Priority Data

Apr. 15, 2016 (FR) .................................... 16 53369
Apr. 15, 2016 (FR) .................................... 16 53371

(51) Int. Cl.
| | |
|---|---|
| *H02M 3/158* | (2006.01) |
| *H01L 29/06* | (2006.01) |
| *H01L 29/861* | (2006.01) |
| *H01L 29/10* | (2006.01) |
| *H01L 29/423* | (2006.01) |
| *H01L 29/78* | (2006.01) |
| *H01L 27/06* | (2006.01) |
| *H01L 27/092* | (2006.01) |

(52) U.S. Cl.
CPC ........ *H01L 29/063* (2013.01); *H01L 27/0629* (2013.01); *H01L 29/1095* (2013.01); *H01L 29/42364* (2013.01); *H01L 29/7802* (2013.01); *H01L 29/861* (2013.01); *H02M 3/158* (2013.01); *H01L 27/0922* (2013.01)

(58) Field of Classification Search
CPC ............... H01L 29/063; H01L 29/1095; H01L 29/42364; H01L 29/7802
USPC ........................................................ 257/329
See application file for complete search history.

(56) References Cited

U.S. PATENT DOCUMENTS

| | | |
|---|---|---|
| 8,148,748 B2 | 4/2012 | Ankoudinov et al. |
| 8,421,118 B2 | 4/2013 | Ankoudinov et al. |
| 8,633,521 B2 | 1/2014 | Ankoudinov et al. |
| 9,029,921 B2 | 5/2015 | Ankoudinov et al. |

(Continued)

OTHER PUBLICATIONS

Vernulapati, U.R. et al., "The Concept of a Regenerative Diode," Proceedings of the 19th International Symposium on Power Semiconductor Devices & ICs, May 27-30, 2007, pp. 193-196.

*Primary Examiner* — Moazzam Hossain
*Assistant Examiner* — Warren H Kilpatrick
(74) *Attorney, Agent, or Firm* — Slater Matsil, LLP (57) ABSTRACT

A diode includes upper and lower electrodes and first and second N-type doped semiconductor substrate portions connected to the lower electrode. A first vertical transistor and a second transistor are formed in the first portion and series-connected between the electrodes. The gate of the first transistor is N-type doped and coupled to the upper electrode. The second transistor has a P channel and has a P-type doped gate. First and second doped areas of the second conductivity type are located in the second portion and are separated by a substrate portion topped with another N-type doped gate. The first doped area is coupled to the gate of the second transistor. The second doped area and the other gate are coupled to the upper electrode.

24 Claims, 7 Drawing Sheets

(56) References Cited

U.S. PATENT DOCUMENTS

2006/0250736 A1  11/2006  Harris
2014/0131763 A1   5/2014  Ankoudinov et al.
2017/0263712 A1*  9/2017  Siemieniec ......... H01L 29/1608

* cited by examiner

VERTICAL SEMICONDUCTOR STRUCTURE

CROSS-REFERENCE TO RELATED APPLICATIONS

This application claims the priority of French patent application number 1653369, filed Apr. 15, 2016 and French patent application number 1653371, filed Apr. 15, 2016, each of which is hereby incorporated by reference in its entirety to the maximum extent allowable by law.

TECHNICAL FIELD

The present application relates to the field of semiconductor components, and particularly to a diode, that is, an electronic component with two electrodes having a forward current flow direction.

BACKGROUND

Figure 1:
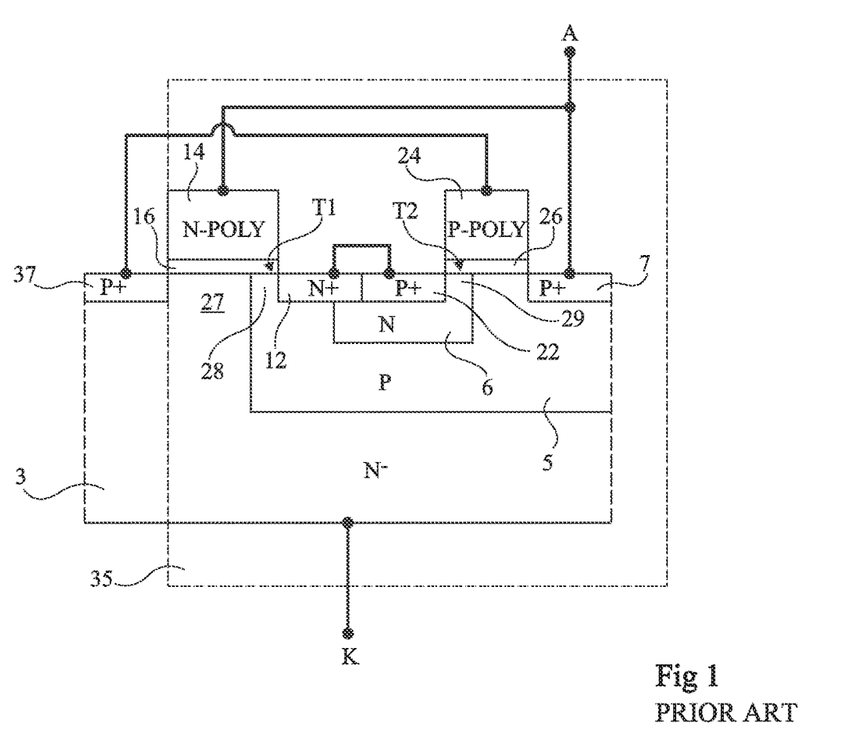
FIG. 1 is a cross-section view of a diode such as described in U.S. Pat. No. 9,029,921.

FIG. 1 is a cross-section view of a diode and corresponds to FIG. 5 of U.S. Pat. No. 9,029,921. This diode is capable of having a very small forward voltage drop and of withstanding high voltages in the reverse direction, for example, several tens of volts. It may for example be used in a diode rectifier or in a DC/DC power converter such as a serial chopper.

Diode 1 is formed inside and on top of a lightly-doped N-type semiconductor substrate 3(N-) located between a cathode K connected to the lower surface and an anode A.

The upper portion of substrate 3 contains a P-type doped well 5. The upper portion of well 5 comprises a well 6 that is more heavily N-type doped than the substrate 3. An area 7 separated from N well 6 and more heavily P-type doped than well 5 is located in the upper portion of well 5. An area 12 more heavily N-type doped than well 6 is located in the upper portion of P well 5 astride N well 6. An N-type doped polysilicon gate 14 (N-POLY) on an insulator 16 covers a portion of well 5 located between area 12 and the substrate, and extends above the substrate. A P-type doped source area 22 more heavily-doped than well 5 is located in the upper portion of well 6 and in contact with area 12. A P-type doped polysilicon gate 24 (P-POLY) extends on an insulator 26 between areas 7 and 22 and thus covers a portion of N well 6.

An N-channel vertical MOS transistor T1 having its source corresponding to area 12, its drain corresponding to a portion 27 of the substrate, and its channel-forming region corresponding to an upper portion 28 of well 5 has thus been obtained. Gate 14 of transistor T1 covers the channel-forming region and portion 27 of the substrate.

A P-channel MOS transistor T2 having its source corresponding to area 22, its drain corresponding to well 5, and its channel-forming region corresponding to a portion 29 of well 6, has also been formed.

Source areas 12 and 22 of transistors T1 and T2 are interconnected. Gate 14 of transistor T1 and drain area 5 of transistor T2 are connected to anode A of the diode. Transistors T1 and T2 are series-connected between cathode K and anode A, gate 14 of transistor T1 being connected to the anode. The two transistors thus connected form a conduction structure 35.

An area 37 extends in the upper portion of substrate 3 from portion 27 of the substrate away from gate 14 of transistor T1. Area 37 is coupled to gate 24 of transistor T2 and forms a control structure.

When the voltage between the anode and the cathode is positive, transistors T1 and T2 are conductive. When the voltage between the anode and the cathode is negative, the gates are taken to potentials which block the transistors.

The above-mentioned patent indicates that insulators 16 and 26 should be thin under gates 14 and 24 so that the diode can conduct a current at low forward voltages, and that control structure 37 supplies gate 24 with an adapted potential; indeed, the direct application on this gate of a strong reverse voltage might damage insulator 26.

However, the above diodes have various performance problems. It is desired to have diodes with improved performances.

SUMMARY

It is provided to modify, on the one hand, the conduction structure, on the other hand, the control structure of a diode such as described hereabove.

Thus, an embodiment provides a diode comprising, between an upper electrode and a lower electrode: first and second portions of semiconductor substrate of a first conductivity type connected to the lower electrode; a first vertical transistor and a second transistor formed in the first portion and series-connected between the electrodes, the gate of the first transistor being doped with the first conductivity type and coupled to the upper electrode, the second transistor having a channel of a second conductivity type and having a doped gate of the second conductivity type; and first and second doped areas of the second conductivity type located in the second portion and separated by a substrate portion topped with another doped gate of the first conductivity type, the first doped area being used as a potential probe and being coupled to the gate of the second transistor, the second doped area and the other gate being coupled to the upper electrode.

According to an embodiment, the first transistor comprises a source area located in a first doped well of the second conductivity type. An upper portion of the first well is a channel-forming region of the first transistor. The second transistor comprises a source area located in a second doped well of the first conductivity type located in the first well. An upper portion of the second well is a channel-forming region of the second transistor.

According to an embodiment, the second transistor has a gate covering a portion of the first well.

According to an embodiment, the first transistor comprises a source area located in a doped well of the second conductivity type. An upper portion of the well is a channel-forming region of the first transistor. The second transistor has a channel-forming region located outside of the well.

According to an embodiment, each of the gates is associated with a gate insulator having a thickness smaller than 10 nm.

According to an embodiment, the first doped area and the substrate of the second portion form a PN junction.

According to an embodiment, a third transistor couples the first doped area to the substrate, the third transistor having a subthreshold operation at a zero voltage.

According to an embodiment, the third transistor has a gate common with the other gate.

According to an embodiment, the other gate and the second doped area surround the first doped area.

According to an embodiment, the first and second portions are portions of the same semiconductor substrate.

According to an embodiment, the diode comprises a plurality of first portions and a plurality of second portions, the gate of the second transistor of each first portion being coupled to a first doped area of a second portion.

An embodiment provides a rectifying bridge with diodes, comprising the above diode.

An embodiment provides a DC-DC power converter comprising the above diode.

Another embodiment provides a diode comprising: a portion of doped semiconductor substrate of a first conductivity type between an upper electrode and a lower electrode; a first vertical transistor having a channel of the first conductivity type, having a doped gate of the first conductivity type and coupled to the upper electrode, the first transistor having a source area included in a doped well of a second conductivity type, the first transistor having a channel-forming region located in the well; a second transistor having a channel of the second conductivity type having a doped gate of the second conductivity type and a channel-forming region located outside of the well, the first and second transistors being series-connected between the electrodes; and a doped probe area of the second conductivity type, which extends from a portion of the substrate covered with the gate of the first transistor, the probe area being coupled to the gate of the second transistor.

According to an embodiment, each of the gates is associated with a gate insulator having a thickness smaller than 10 nm.

According to an embodiment, the first and second transistors have a subthreshold operation at a zero voltage.

According to an embodiment the channel-forming region of the first transistor is doped with from $5*10^{16}$ to $5*10^{17}$ atoms/cm$^3$.

According to an embodiment the channel-forming region of the second transistor is doped with from $10^{16}$ to $5*10^{17}$ atoms/cm$^3$.

An embodiment provides a rectifying bridge with diodes, comprising the above diode.

An embodiment provides a DC-DC power converter comprising the above diode.

BRIEF DESCRIPTION OF THE DRAWINGS

The foregoing and other features and advantages will be discussed in detail in the following non-limiting description of specific embodiments in connection with the accompanying drawings.

The same elements have been designated with the same reference numerals in the different drawings and, further, the various drawings are not to scale. For clarity, only those steps and elements which are useful to the understanding of the described embodiments have been shown and are detailed.

DETAILED DESCRIPTION OF ILLUSTRATIVE EMBODIMENTS

In the following description, when reference is made to terms qualifying absolute positions, such as terms "top", "bottom", "left", "right", etc., or relative positions, such as terms "above", "under", "upper", "lower", etc., or to terms qualifying directions, such as term "vertical", etc., it is referred to the orientation of the concerned element in the drawings. Unless otherwise specified, expression "in the order of" means to within 10%, preferably to within 5%.

The inventor has analyzed the operation of a diode of the type of the diode illustrated in FIG. 1.

Figure 2A:
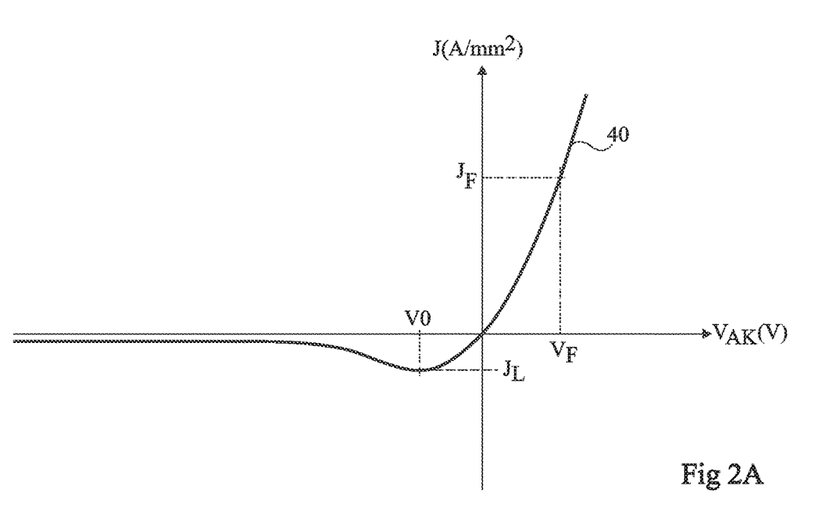
FIG. 2A is a current-vs.-voltage curve.

FIG. 2A is a curve 40 which schematically shows current density J in A/mm$^2$ in diode 1 of FIG. 1 according to the voltage $V_{AK}$ applied between anode A and cathode K.

Each of transistors T1 and T2 has a non-zero conductance when the voltage between its gate and its source is zero, although this voltage is smaller than the value allowing the forming of a fully-conductive channel. Thus, such transistors have a subthreshold conduction at a zero voltage. To achieve this, insulators 16 and 26 under gates 14 and 24 are thin (nanometer-range) and the dopings of the gates and of channel-forming regions 28 and 29 of the transistors are appropriately selected. As an example, channel-forming region 28 may be doped with from $5*10^{16}$ to $5*10^{17}$ atoms/cm$^3$. Channel-forming region 29 may be doped with from $10^{17}$ to $5*10^{17}$ atoms/cm$^3$. Gate 14 may be doped with more than $5*10^{18}$ atoms/cm$^3$. Gate 24 may be doped with more than $5*10^{18}$ atoms/cm$^3$. Insulators 16 and 26 may be made of silicon oxide and have thicknesses smaller than 10 nm.

When voltage $V_{AK}$, initially zero, becomes more and more negative, the reverse current or leakage current first increases due to the initial conductance of transistors T1 and T2. The more negative the voltage, on the one hand, the more the potential of gate 24 connected to control structure 37 increases with respect to the potential of well 6 and of area 22 and blocks P-channel transistor T2, and, on the other hand, the more the potential of gate 14 connected to the anode decreases with respect to the potential of area 12 and blocks N-channel transistor T1. The reverse current ends up being negligible. The leakage current density reaches a maximum value $J_L$ when voltage $V_{AK}$ has a negative value V0.

When voltage $V_{AK}$, initially zero, becomes more and more positive, the potentials present on the gates of transistors T1 and T2, initially slightly conductive, make these transistors more and more conductive. When the current density reaches a nominal value $J_F$, the voltage drop corresponds to forward voltage drop $V_F$ of the diode. Due to the operation of transistors T1 and T2, diode 1 has a low forward voltage drop $V_F$ for a high nominal current of density $J_F$. Such a forward voltage drop is for example smaller than 0.2 V when nominal current density $J_F$ is in the order of 0.5 A/mm$^2$.

The maximum leakage current density value $J_L$ and the value of forward voltage drop $V_F$ happen to be linked. Thus, a diode having a low forward voltage drop $V_F$ has a high leakage current in the reverse direction. It is desired to decrease forward voltage drop $V_F$ without increasing maximum value $J_L$, or to decrease maximum leakage value $J_L$ without increasing forward voltage drop $V_F$.

Figure 2B:
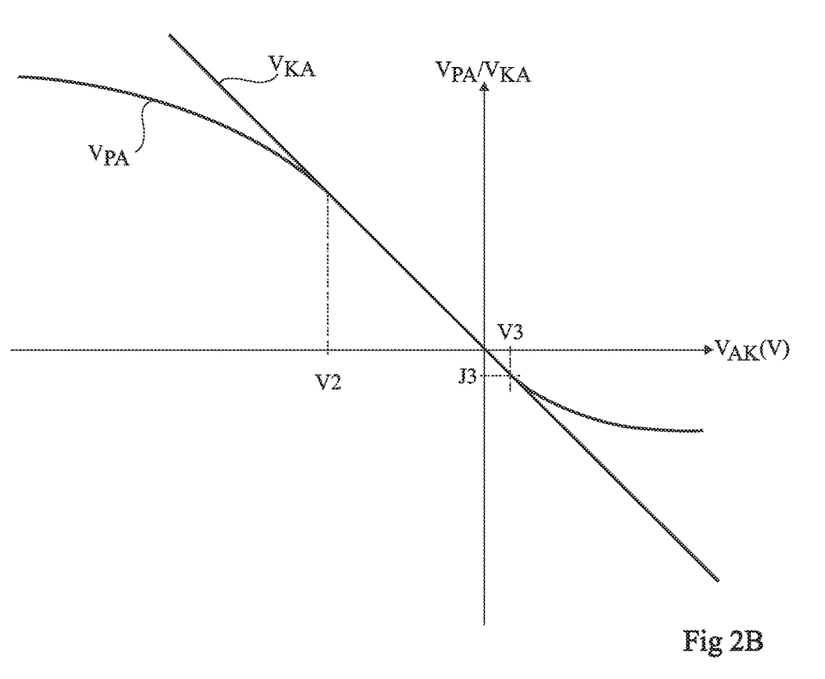
FIG. 2B is a voltage-vs.-voltage curve.

FIG. 2B is a curve illustrating voltage $V_{PA}$ between area 37 and anode A and voltage $V_{KA}$ between the cathode and the anode, according to voltage $V_{AK}$ between the anode and the cathode. When voltages $V_{PA}$ and $V_{KA}$ are equal, area 37 and the cathode are at the same potential. Voltage $V_{PA}$ corresponds to the voltage withstood by gate insulator 24 of transistor T2.

The P-N junction between P-type doped area 37 and substrate 3 has a non-zero conductance which enables to charge or discharge gate 24 of transistor T2 when voltage $V_{AK}$ varies. The potential of area 37 is thus maintained equal to the potential of the portions of substrate 3 surrounding area 37. Area 37 thereby forms a potential probe.

When initially-zero voltage $V_{AK}$ starts becoming negative, the voltage drop between the anode and the cathode essentially occurs in transistors T1 and T2. The potential of probe 37 is thus equal to the cathode potential.

When voltage $V_{AK}$ becomes more negative than a negative voltage V2 in the range from −0.2 to −5 V, a depleted area extending under gate 14 in region 27 continues under probe 37. Part of the voltage drop between the anode and the cathode occurs between the bottom and the top of the depleted area. The more voltage $V_{AK}$ is negative, the more the depleted area extends vertically and supports most of the voltage drop. Now, the potential of probe 37 remains close to the potential of the substrate portion located immediately under gate 14. The voltage drop between the anode and probe 37 remains limited and voltage $V_{PA}$ remains withstandable by thin insulator 26 of gate 24 of transistor T2.

When initially-zero voltage $V_{AK}$ increases positively, most of the voltage drop between the anode and the cathode occurs in transistors T1 and T2 as long as the current density is lower than a value $J_3$, for example in the range from 0.1 to 1 A/mm$^2$, corresponding to a voltage $V_3$. When the voltage between the anode and the cathode is greater than voltage $V_3$, substrate 3 provides a resistance to the flowing of the current in a portion located under probe 37. Thus the potential of probe 37 is higher than the cathode potential. Transistor T2 is less conductive than if the potential of probe 37 remained equal to the cathode potential, and forward voltage drop $V_F$ of the diode is thus greater.

Now, as previously indicated, forward voltage drop $V_F$ is desired to be decreased—without increasing maximum leakage current density value $J_L$.

Figure 3:
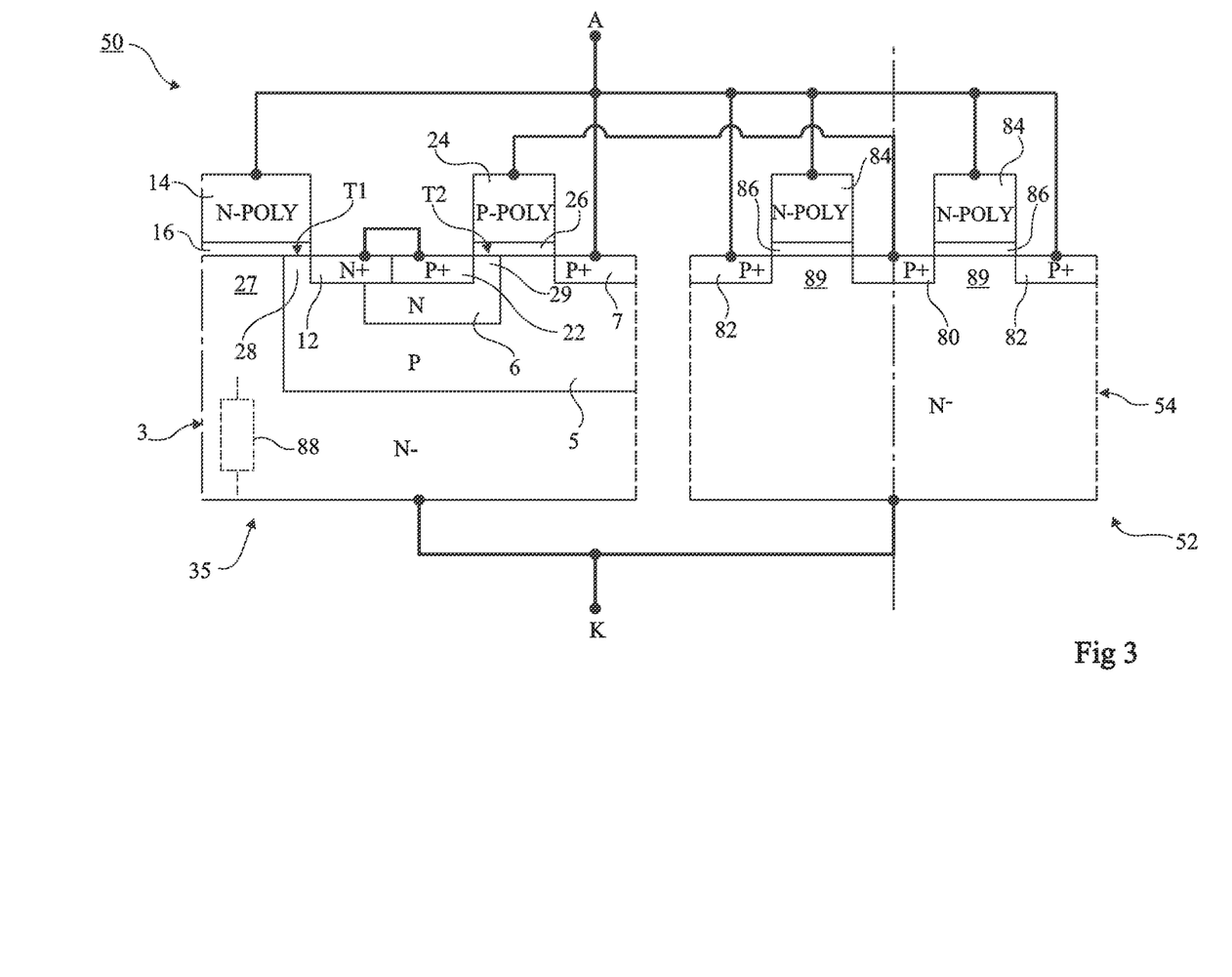
FIG. 3 is a simplified cross-section view of an embodiment of a diode.

FIG. 3 is a simplified cross-section view of an embodiment of a diode 50. Diode 50 comprises, on the left-hand side of the drawing, a conduction structure 35 identical to conduction structure 35 of FIG. 1, the elements of which are designated with the same reference numerals. Diode 50 further comprises a control structure 52, on the right-hand side of the drawing.

Conduction structure 35 is formed inside and on top of a portion 3 of an N-type doped semiconductor substrate, for example, silicon. Control structure 52 is formed inside and on top of a semiconductor substrate portion 54. Portions 3 and 54 may be different portions of the same substrate or portions of two separate substrates. Each portion 3, 54 has its lower surface coupled to cathode K of the diode.

In control structure 52, the upper portion of substrate portion 54 contains P-type doped areas 80 and 82. Doped area 82 surrounds doped area 80. A ring-shaped gate 84 extends on an insulator 86 on the surface located between doped areas 80 and 82. Gate 84 is made of N-type doped polysilicon. Gate 84 and doped area 82 are coupled to anode A. Doped area 80 is coupled to gate 24 of transistor T2.

The P-N junction between doped area 80 and the substrate has a non-zero conductance. Doped area 80 thus forms a potential probe which determines the potential of gate 24.

When a current flows from the anode to the cathode in the diode, a positive voltage $V_{AK}$ appears between the anode and the cathode. The P-N junction between doped area 82 and substrate portion 54 limits the current flowing through substrate portion 54. Conduction structure 35 conducts more current than control structure 52. Now, substrate portion 3 of conduction structure 35 and substrate portion 54 of control structure 52 are different, and the most part of the current originating from the anode reaches the cathode by flowing through conduction structure 35 without running through control structure 52, which controls the gate of transistor T2.

Unlike probe 37 of diode 1 of FIG. 1, probe 80 is not located in a region intended for the flowing of current. The flowing of the current through substrate region 3 located under drain area 22 of transistor T1 encounters a resistance 88 which is not located under gate 84 of the control structure or under probe 80. The current density in the substrate portions located under the probe is low, for example, smaller than 10% of the current density in substrate portions 3 corresponding to resistance 88. Thereby, the potential of probe 80 remains in the order of the potential of cathode K. Thus, the voltage drop in transistor T2 controlled by probe 80 is smaller than if the transistor was controlled by a probe of the type of probe 37 of diode 1 of FIG. 1. The operation of transistor T2 of diode 50 is thus improved with respect to the operation of transistor T2 of diode 1. Thereby, the forward voltage drop of diode 50 is smaller than the forward voltage drop of diode 1.

When a negative voltage $V_{AK}$ is applied, the potential of probe 80 remains close to the potential of cathode K as long as voltage V does not exceed a negative voltage from 0.2 to 5 V. The leakage current is then similar in diode 50 and in diode 1 of FIG. 1. However, the voltage drop caused by a current in the forward direction may be much lower in diode 50 than in diode 1.

When voltage $V_{AK}$ becomes more negative than voltage V2 (see FIG. 2B), the operation of probe 80 is similar to the operation of probe 37 of diode 1. A depleted area present in a region 89 of substrate 54 located under gate 84 extends under the probe and extends all the further downwards as voltage V is negative. The most part of voltage V is present between the bottom and the top of this depleted area. The potential probe is taken to the potential of the substrate portion located immediately above the gate. Thereby, the voltage withstood by insulator 26 is compatible with a small insulator thickness. The potential of probe 80 is mainly determined by the dopings of region 89 of substrate 54 and by the configuration of gate 84 and of areas 80 and 82, in particular by the distance between areas 80 and 82, that is, by the lengthwise dimension of gate 84.

As an example, the voltage between probe 80 and the anode is smaller than 5 V when voltage $V_{AK}$ between the anode and the cathode is negative by V. As an example, the distance between areas 80 and 82 is in the range from 0.3 to 1 μm. Gate insulator 86 may have a thickness smaller than 10 nm. As an example, region 89 of the substrate is doped with from $10^{16}$ to $2*10^{17}$ atoms/cm$^3$.

Figure 4:
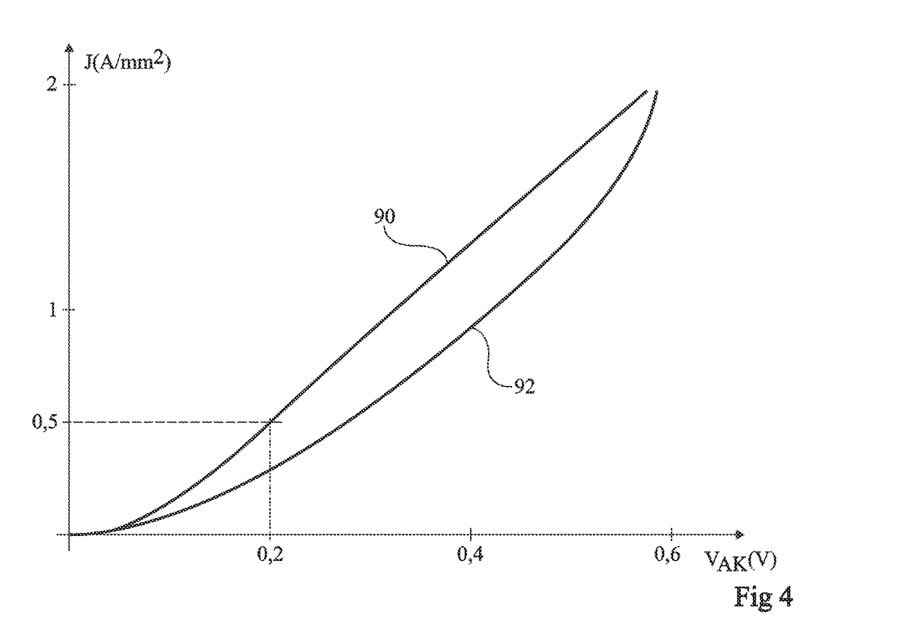
FIG. 4 is a curve illustrating the current density in two diodes.

FIG. 4 illustrates the current density in two diodes according to voltage $V_{AK}$ applied between the anode and the cathode. Curve 90 corresponds to a diode according to the embodiment illustrated in FIG. 3. Curve 92 corresponds to a diode of the type of diode 1 of FIG. 1. The two diodes have identical leakage current densities (not shown). For a given voltage, the current density in diode 50 is higher than the current density in diode 1. For example, for a 0.2-V voltage drop, the current density increases by more than 70%. For a 0.5-A/mm$^2$ current density, the voltage drop is decreased by more than 25%.

Figure 5:
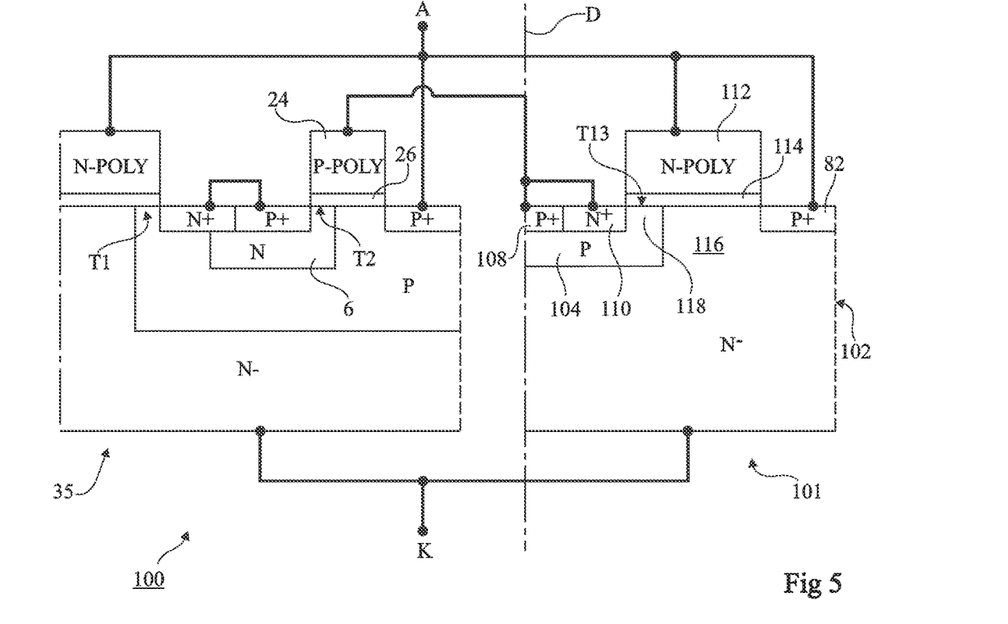
FIG. 5 is a partial cross-section view illustrating an alternative embodiment of a diode.

FIG. 5 is a partial cross-section view illustrating an alternative embodiment of a diode 1oft Diode 100 corresponds to diode 50 of FIG. 3 where control structure 52 has been replaced with a control structure 101. Only a half cross-section of control structure 101 is shown, this structure having a symmetry of revolution with respect to a vertical axis D.

Control structure 101 is formed inside and on top of a semiconductor substrate portion 102, for example, made of N-type doped silicon.

Portion 102 contains a P-type doped well 104 centered on axis D and a ring-shaped P-type doped area 82. Well 104 comprises a P-type doped area 108 more heavily doped than the well and centered on axis D. An N-type doped area 110 in the upper portion of well 104 forms a ring in contact with area 108. A ring-shaped gate 112 arranged on an insulator 114 covers the portions of the substrate and of the well located between area no and area 82. Gate 112 is made of N-type doped polysilicon.

A transistor T13 having its source corresponding to area 110, its drain corresponding to a portion 116 of the substrate, and its channel-forming region corresponding to a portion 118 of well 110 has thus been obtained. It should be noted that gate 112 covers channel-forming region 118 and extends above the substrate all the way to the limit of area 82.

Area 82 and gate 112 are coupled to anode A of the diode. Areas 108 and 110 are coupled together to gate 24 of transistor T2 of conduction structure 35.

N-type doped gate portion 112 topping the substrate of structure 101 plays the same role as gate 84 of control structure 52 of FIG. 2. P-type doped area 108 plays the same role as probe 80 of control structure 52. Control structure 101 corresponds to control structure 52 where the P-N junction which couples doped area 80 to the substrate has been replaced with transistor T13, which couples doped area 108 to the substrate. Transistor T13 has a subthreshold conduction at a zero voltage.

When the voltage applied across the diode varies, charges flow through the P-N junction between probe 80 and the substrate to charge or discharge the gate capacitance of transistor T2 of structure 52. The conductance between the drain and the source of transistor T13 is higher than the conductance of the P-N junction between probe 80 and the substrate of diode 50 of FIG. 3. Thereby, diode 100 has improved reaction times.

Figure 6:
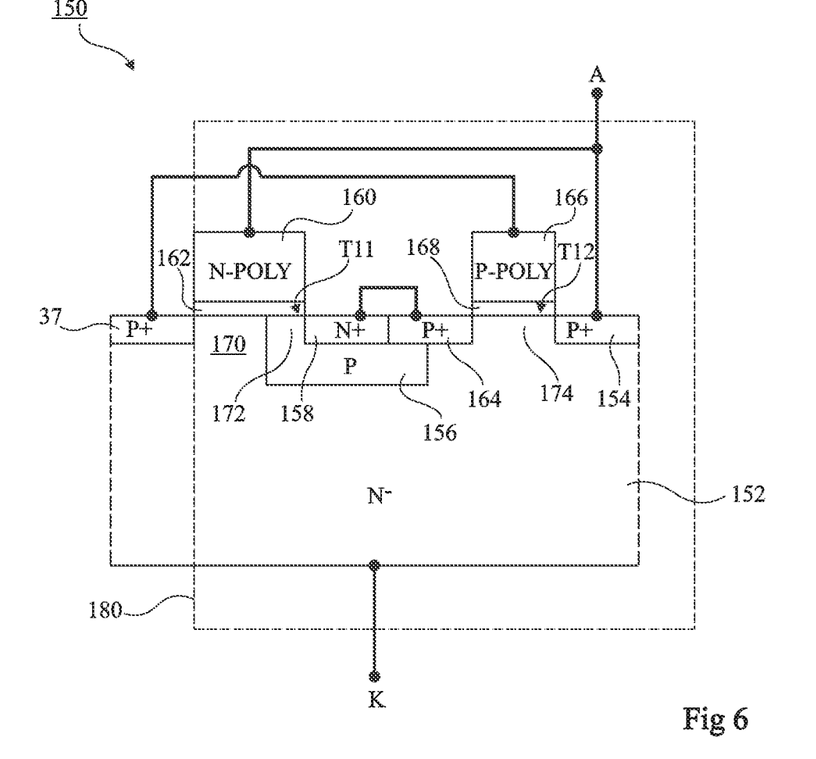
FIG. 6 is a cross-section view illustrating another embodiment of a diode.

FIG. 6 is a cross-section view illustrating an embodiment of a diode 150 comprising a conduction structure different from the conduction structures of FIGS. 1, 3, and 5 and from control structure 37 described in relation with FIG. 1.

Diode 150 comprises a portion of an N-type doped substrate 152 coupled in its lower portion to cathode K of the diode. The upper portion of the substrate contains a P-type doped area 154 and a P-type doped well 156. The upper portion of well 156 contains an area 158 more heavily N-type doped than the substrate. An N-type doped polysilicon gate 160 on an insulator 162 covers a portion of P well 156 located between N area 158 and substrate 152, and continues above substrate 152. An area 164 more heavily P-type doped than well 156 is located in the upper portion of the substrate, astride P well 156 and in contact with N area 158. A P-type doped polysilicon gate 166 extends on an insulator 168 and covers a portion of the substrate located between areas 154 and 164.

An N-channel vertical MOS transistor T11 having its source corresponding to area 158, its drain corresponding to a portion 170 of substrate 152, and its channel-forming region corresponding to an upper portion 172 of P well 156 has been obtained.

A P-channel MOS transistor T12 having its source corresponding to area 164, its drain corresponding to area 154, and its channel-forming area corresponding to a portion 174 of substrate 152, has also been obtained.

Source areas 158 and 164 of transistors T11 and T12 are interconnected. Gate 160 of transistor T11 and drain area 154 of transistor T12 are connected to anode A of the diode.

Transistors T11 and T12 have a subthreshold conduction at a zero voltage. The assembly formed by transistors T11 and T12 thus connected between the cathode and the anode forms a conduction structure 180. A main current may flow, through transistors T12 and T11, along to the same path as through transistors T1 and T2 of conduction structure 35 of FIG. 1.

A P-type doped area 37 is located in the upper portion of substrate 152 and extends from the limit of gate 160 of transistor T11 away from the substrate portion covered with this gate. Area 37 is connected to gate 166 of transistor T12 and corresponds to a control structure which sets the potential of gate 166.

The operation of diode 150 is similar to that of diode 1 of FIG. 1. Indeed, transistors T11 and T12 of diode 150 play the respective role of transistors T1 and T2 of diode 1 and control structure 37 corresponds to a potential probe having an operation identical to that of potential probe 37 of diode 1.

According to an advantage, the elements of diode 150 located in the upper portion of substrate 152 have a particularly simple layout and may be obtained in a limited number of steps. In particular, the doping level of channel-forming area 174 of transistor T12 does not result from a superposition of a plurality of steps of doping of different types. Thereby, the desired doping level is simpler to obtain for area 174 than for channel-forming area 29 of transistor T2 of FIG. 1.

As an example, channel-forming region 172 may be doped with from $5*10^{16}$ to $5*10^{17}$ atoms/cm$^3$. Channel-forming region 174 may be doped with from $10^{16}$ to $5*10^{17}$ atoms/cm$^3$. Gate 160 may be doped with from $5*10^{18}$ to $5*10^{20}$ atoms/cm$^3$. Gate 166 may be doped with from $5*10^{18}$ to $5*10^{20}$ atoms/cm$^3$. Gate insulators 162 and 168 may have thicknesses smaller than 10 nm.

Figure 7:
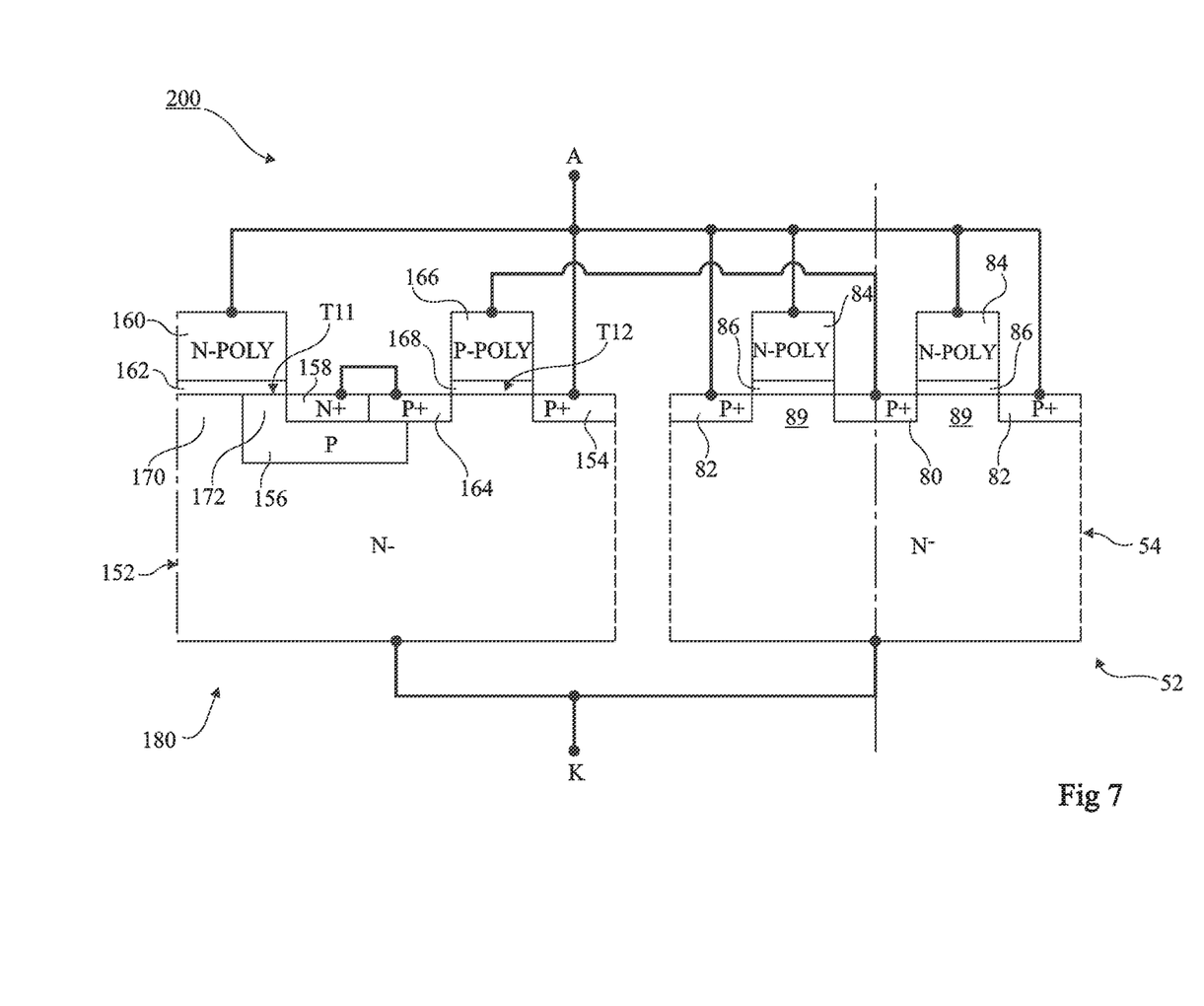
FIG. 7 is a simplified cross-section view of another embodiment of a diode.

FIG. 7 is a simplified cross-section view of another embodiment of a diode 200. Diode 200 correspond to a combination of conduction structure 180 described in relation with FIG. 6 and control structure 52 described in relation with FIG. 3 and the same elements are designed therein with the same reference numerals.

Conduction structure 180 located in the left-hand portion of the drawing comprises transistors T11 and T12 series-connected between the cathode and the anode of the diode. Control structure 52 comprises doped area 82 and gate 84 connected to the anode of the diode and probe 80. Probe 80 is coupled to gate 166 of transistor T2.

Figure 8:
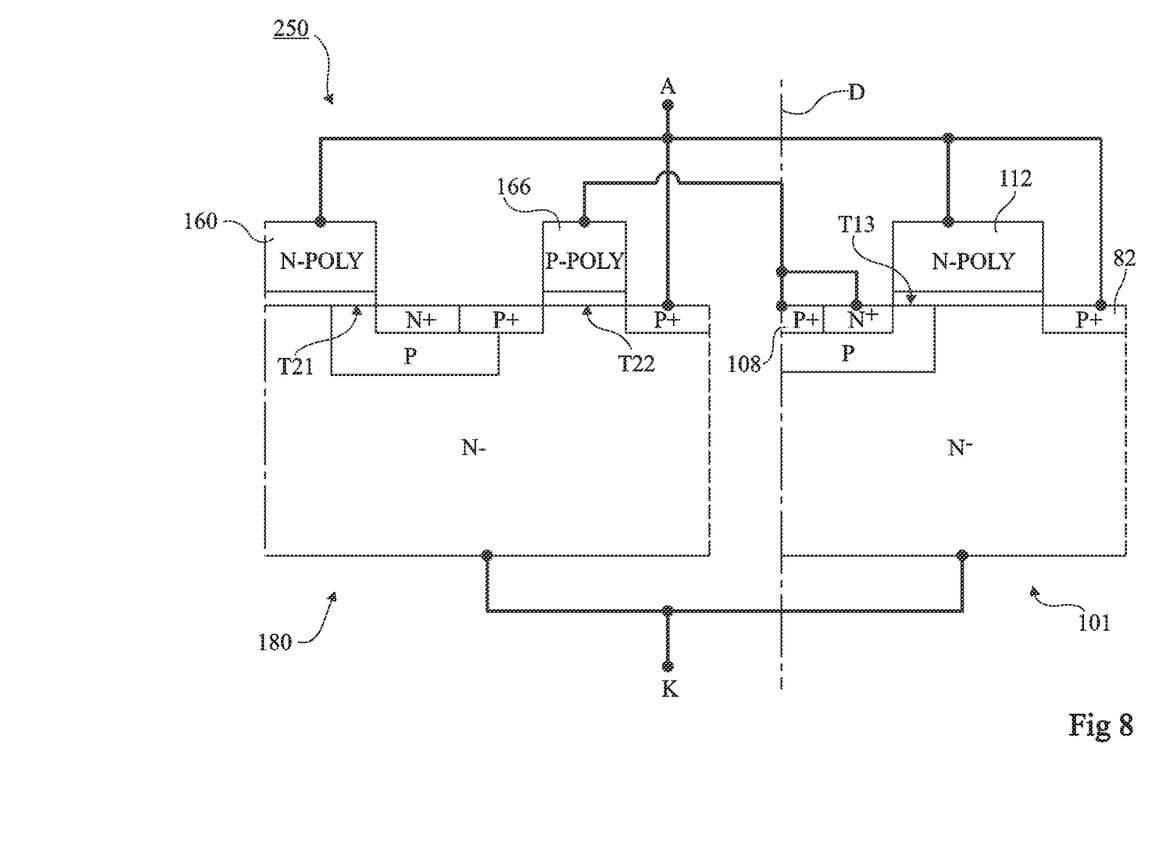
FIG. 8 is a partial cross-section view illustrating an alternative embodiment of a diode.

FIG. 8 is a partial cross-section view illustrating an alternative embodiment of a diode 250 combining conduction structure 180 described in relation with FIG. 6 with control structure 101 described in relation with FIG. 5.

Control structure 101, on the right-hand side of the drawing, comprises gate 112 and doped area 82 connected to the anode of the diode, and probe area 108. Probe area 108 is connected to gate 166 of transistor T12.

Specific embodiments have been described. Various alterations, modifications, and improvements will occur to those skilled in the art. In particular, in the described embodiments, the diodes are formed inside and on top of N-type doped substrates, the cathode being the lower electrode and the anode being the upper electrode. Other embodiments are possible, where the substrate is P-type doped and, as compared with the previously-described embodiments, cathode K and anode A are inverted, as well as conductivity types N and P.

Further, the previously-described embodiments of diodes comprise a control structure coupled to a single conduction structure (35 or 180). Other embodiments are possible, which comprise a control structure coupled with a plurality of conduction structures connected in parallel between the anode and the cathode of the diode. In particular, control structure 101 of FIG. 5 may be simultaneously coupled to a larger number of conduction structures than a potential probe 80 of a control structure 52 of FIG. 3. Other embodiments are also possible, which comprise a plurality of control structures.

Further, in the previously-described embodiments, control structures comprise elements of revolution around an axis D running through a potential probe. In other embodiments, these elements may have different shapes and may totally or partially surround the probe.

Similarly, it can be considered that the shown conduction structures only show half cross-sections of ring-shaped structures.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A semiconductor device comprising:
an upper electrode;
a lower electrode;
first and second semiconductor substrate portions of a first conductivity type connected to the lower electrode;
a first vertical transistor formed in the first semiconductor substrate portion, the first vertical transistor having a gate that is doped with the first conductivity type and is coupled to the upper electrode, the first vertical transistor comprising a first channel-forming region of a second conductivity type;
a second vertical transistor formed in the first semiconductor substrate portion, the first and second transistors being series-connected between the upper and lower electrodes, the second vertical transistor having a doped gate of the second conductivity type, the second vertical transistor comprising a second channel-forming region of the first conductivity type;
a first doped area of the second conductivity type located in the second semiconductor substrate portion, the first doped area coupled to the gate of the second vertical transistor;
a second doped area of the second conductivity type located in the second semiconductor substrate portion and separated from the first doped area by a third doped region of the first conductivity type, the second doped area being coupled to the upper electrode; and
a further doped gate of the first conductivity type over the third doped region, the further doped gate being coupled to the upper electrode.

2. The semiconductor device of claim 1, wherein:
the first vertical transistor comprises a source area located in a first doped well of the second conductivity type, an upper portion of the first well forming the first channel-forming region of the first vertical transistor; and
the second vertical transistor comprises a source area located in a second doped well of the first conductivity type located in the first well, an upper portion of the second well forming the second channel-forming region of the second transistor.

3. The semiconductor device of claim 2, wherein the second vertical transistor comprises a gate overlying a portion of the first well.

4. The semiconductor device of claim 1, wherein:
the first vertical transistor comprises a source area located in a first doped well of the second conductivity type, an upper portion of the first well forming the first channel-forming region of the first vertical transistor; and
the second vertical transistor comprises the second channel-forming region located outside of the first doped well.

5. The semiconductor device of claim 1, wherein the gate of the first vertical transistor and the gate of the second vertical transistor are each separated from the first substrate portion by a gate insulator having a thickness smaller than 10 nm, and wherein the further doped gate is separated from the second substrate portion by a gate insulator having a thickness smaller than 10 nm.

6. The semiconductor device of claim 1, wherein the first doped area and the second semiconductor substrate portion form a PN junction.

7. The semiconductor device of claim 1, wherein a third transistor couples the first doped area to the second substrate portion, the third transistor having a subthreshold operation at a zero voltage.

8. The semiconductor device of claim 7, wherein the third transistor has a gate common with the further doped gate.

9. The semiconductor device of claim 1, wherein the further doped gate and the second doped area surround the first doped area.

10. The semiconductor device of claim 1, wherein the first semiconductor substrate portion and the second semiconductor substrate portion are portions of the same semiconductor substrate.

11. The semiconductor device of claim 1, wherein the first semiconductor substrate portion is a portion of a first substrate and the second semiconductor substrate portion is a portion of a second substrate that is separate from the first substrate.

12. The semiconductor device of claim 1, comprising a plurality of first semiconductor substrate portions that each comprise a corresponding first vertical transistor and a plurality of second semiconductor substrate portions that each comprise a corresponding second vertical transistor, the gate of the second vertical transistor of each of the corresponding first vertical transistor being coupled to a corresponding first doped area of a second semiconductor substrate portion of the plurality of second semiconductor substrate portions.

13. The semiconductor device of claim 1, wherein semiconductor device is part of a rectifying bridge.

14. The semiconductor device of claim 1, wherein the semiconductor device is part of a DC-DC power converter.

15. A diode comprising:
a semiconductor substrate having an upper surface and a lower surface opposite the upper surface;

an upper electrode adjacent the upper surface of the semiconductor substrate;

a lower electrode adjacent the lower surface of the semiconductor substrate, wherein the diode is a two-terminal device having a first terminal at the upper electrode and a second electrode at the lower electrode;

a conduction structure disposed within the semiconductor substrate between the upper electrode and the lower electrode, the conduction structure comprising an n-channel transistor coupled in series with a p-channel transistor disposed adjacent the upper surface of the substrate; and a control structure disposed within the semiconductor substrate between the upper electrode and the lower electrode and laterally spaced from the conduction structure, the control structure comprising a third transistor disposed at the upper surface of the semiconductor substrate, the third transistor including a gate coupled to the upper electrode, a first doped area coupled to a gate of the p-channel transistor, a second doped area coupled to the upper electrode, wherein the first doped area is configured to be used as a potential probe;

wherein the conduction structure and the control structure are configured so that during operation of the diode, a current flows between the upper and lower electrodes, a larger fraction of the current flowing within the conduction structure than the control structure.

16. The diode of claim 15, wherein the substrate comprises an n-doped substrate, wherein the p-channel transistor comprises a source area located in a p-doped well in the substrate, an upper portion of the p-doped well forming a channel region of the n-channel transistor, and wherein the n-channel transistor comprises a source area located in an n-doped well located in the p-doped well, an upper portion of the n-doped well forming a channel region of the second transistor.

17. The diode of claim 15, wherein the substrate comprises an n-doped substrate, wherein the n-channel transistor comprises an n-doped source area located in a p-doped well, an upper portion of the p-doped well forming a channel region of the n-channel transistor, and wherein the p-channel transistor comprises a p-doped source area located in an n-doped well that is located in the p-doped well, an upper portion of the n-doped well forming a channel region of the p-doped transistor.

18. The diode of claim 17, wherein the second transistor comprises a gate overlying a portion of the p-doped well that does not include the n-doped well.

19. The diode of claim 15, wherein the n-channel transistor comprises an n-doped source area located in a p-doped well, an upper portion of the p-doped well forming a channel region of the n-doped transistor, and wherein the p-channel transistor comprises a channel region located outside of the first doped well.

20. The diode of claim 15, wherein the third transistor comprises an annular transistor where the second doped area encircles the first doped area.

21. A semiconductor structure comprising:

a substrate of a first conductivity type, the substrate having an upper surface and a lower surface opposite the upper surface;

an upper electrode adjacent the upper surface of the substrate;

a lower electrode electrically coupled to the lower surface of the substrate;

a first well of a second conductivity type opposite of the first conductivity type disposed at an upper portion of the substrate;

a second well of the first conductivity type disposed within the first well;

a first doped region of the first conductivity type disposed within the first well;

a second doped region of the second conductivity type disposed within the second well and electrically coupled to the first doped region;

a first gate overlying a portion of the first well adjacent the first doped region, the first gate electrically coupled to the upper electrode;

a second gate overlying a portion of the second well adjacent the second doped region;

a third doped region of the second conductivity type disposed within the substrate and laterally spaced from the first and second doped regions the third doped region electrically coupled to the upper electrode;

a fourth doped region of the second conductivity type disposed within the substrate and laterally spaced from the third doped region by a portion of the substrate, the fourth doped region being electrically coupled to the second gate; and a third gate overlying the portion of the substrate between the third and fourth doped regions, the third gate being electrically coupled to the upper electrode.

22. The semiconductor structure of claim 21, wherein the first and third gates are doped with the first conductivity type and wherein the second gate is doped with the second conductivity type.

23. The semiconductor structure of claim 21, wherein a first transistor is formed by the first doped region, the portion of the first well adjacent the first doped region, a portion of the substrate adjacent the portion of the first well adjacent the first doped region and the first gate;

wherein a second transistor is formed by the second doped region, the portion of the second well adjacent the second doped region, a fifth doped region of the second conductivity type and the second gate, the second doped region being spaced from the fifth doped region by the portion of the second well adjacent the second doped region; and wherein a third transistor is formed by the third doped region, the fourth doped region, the portion of the substrate between the third and fourth doped regions, and the third gate.

24. The semiconductor structure of claim 21, wherein the semiconductor structure forms a diode that includes a conduction structure and a control structure, wherein the conduction structure comprises the first well, the second well, the first doped region, the second doped region, the first gate, and the second gate, and wherein the control structure comprises the third doped region, the fourth doped region, and the third gate, wherein the fourth doped region is configured to be used as a potential probe.

* * * * *

UNITED STATES PATENT AND TRADEMARK OFFICE
CERTIFICATE OF CORRECTION

PATENT NO. : 10,177,218 B2
APPLICATION NO. : 15/365335
DATED : January 8, 2019
INVENTOR(S) : Frédéric Lanois Page 1 of 1

It is certified that error appears in the above-identified patent and that said Letters Patent is hereby corrected as shown below:

On the Title Page

Item (73) Assignee, Line 1, delete "STIMICROELECTRONICS" and insert --STMICROELECTRONICS--.

Signed and Sealed this
Twelfth Day of March, 2019

Andrei Iancu
*Director of the United States Patent and Trademark Office*